(12) United States Patent
Andre et al.

(10) Patent No.: US 7,292,484 B1
(45) Date of Patent: Nov. 6, 2007

(54) SENSE AMPLIFIER WITH MULTIPLE BITS SHARING A COMMON REFERENCE

(75) Inventors: Thomas W. Andre, Austin, TX (US); Brad J. Garni, Austin, TX (US); Joseph J. Nahas, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/422,774

(22) Filed: Jun. 7, 2006

(51) Int. Cl.
*G11C 5/14* (2006.01)
*G11C 7/10* (2006.01)
*G11C 7/06* (2006.01)
*G11C 7/02* (2006.01)

(52) U.S. Cl. .................... 365/189.09; 365/189.03; 365/189.05; 365/189.07; 365/207

(58) Field of Classification Search ......... 365/189.07, 365/189.09, 207, 210
See application file for complete search history.

(56) References Cited

U.S. PATENT DOCUMENTS

| | | |
|---|---|---|
| 6,269,040 B1 | 7/2001 | Reohr et al. |
| 6,600,690 B1 | 7/2003 | Nahas et al. |
| 6,946,882 B2 | 9/2005 | Gogi et al. |
| 2006/0044907 A1* | 3/2006 | Forbes et al. ............ 365/207 |
| 2006/0285406 A1* | 12/2006 | Pan et al. ................ 365/207 |

OTHER PUBLICATIONS

Edward K. S. Au, et al., A Novel Current-Mode Sensing Scheme for Magnetic Tunnel Junction MRAM, IEEE, vol. 40, No. 2, Mar. 2004, pp. 483-488.
T. M. Maffitt, et al., Design Considerations for MRAM, IBM J. Res. & Dev., vol. 50, No. 1, Jan. 2006, pp. 25-39.

* cited by examiner

*Primary Examiner*—Ly Duy Pham
(74) *Attorney, Agent, or Firm*—Ranjeev Singh; James L. Clingan, Jr.

(57) ABSTRACT

A memory circuit includes a sense amplifier in which a single reference signal is compared to two data signals from two memory cells. The reference signal is generated from the combination of memory cells in opposite logic states. The data signal capacitance is matched to the reference signal capacitance. With reduced but matched capacitance both high speed and high sensitivity can be achieved.

20 Claims, 6 Drawing Sheets

US 7,292,484 B1

SENSE AMPLIFIER WITH MULTIPLE BITS SHARING A COMMON REFERENCE

BACKGROUND OF THE INVENTION

1. Field of the Invention

This invention relates in general to sense amplifiers and more specifically to a sense amplifier with multiple bits sharing a common reference.

2. Description of the Related Art

Sensing the state of a memory having at least two distinct resistance states, such as a magneto-resistive RAM (MRAM) requires comparison of an average signal (developed from a reference high bit and a reference low bit) with a bit cell signal. This comparison results in one data output. Typically, each data output of a MRAM module requires a pair of reference columns (one for reference high bit and the other for reference low bit). Use of a pair of reference columns for each data output increases the memory area. Moreover, each pair of reference columns consumes power, thus increasing the power consumption of the MRAM module.

Thus, there is a need for a sense amplifier with multiple bits sharing a common reference.

BRIEF DESCRIPTION OF THE DRAWINGS

The present invention may be better understood, and its numerous objects, features, and advantages made apparent to those skilled in the art by referencing the accompanying drawings.

Figure 1:
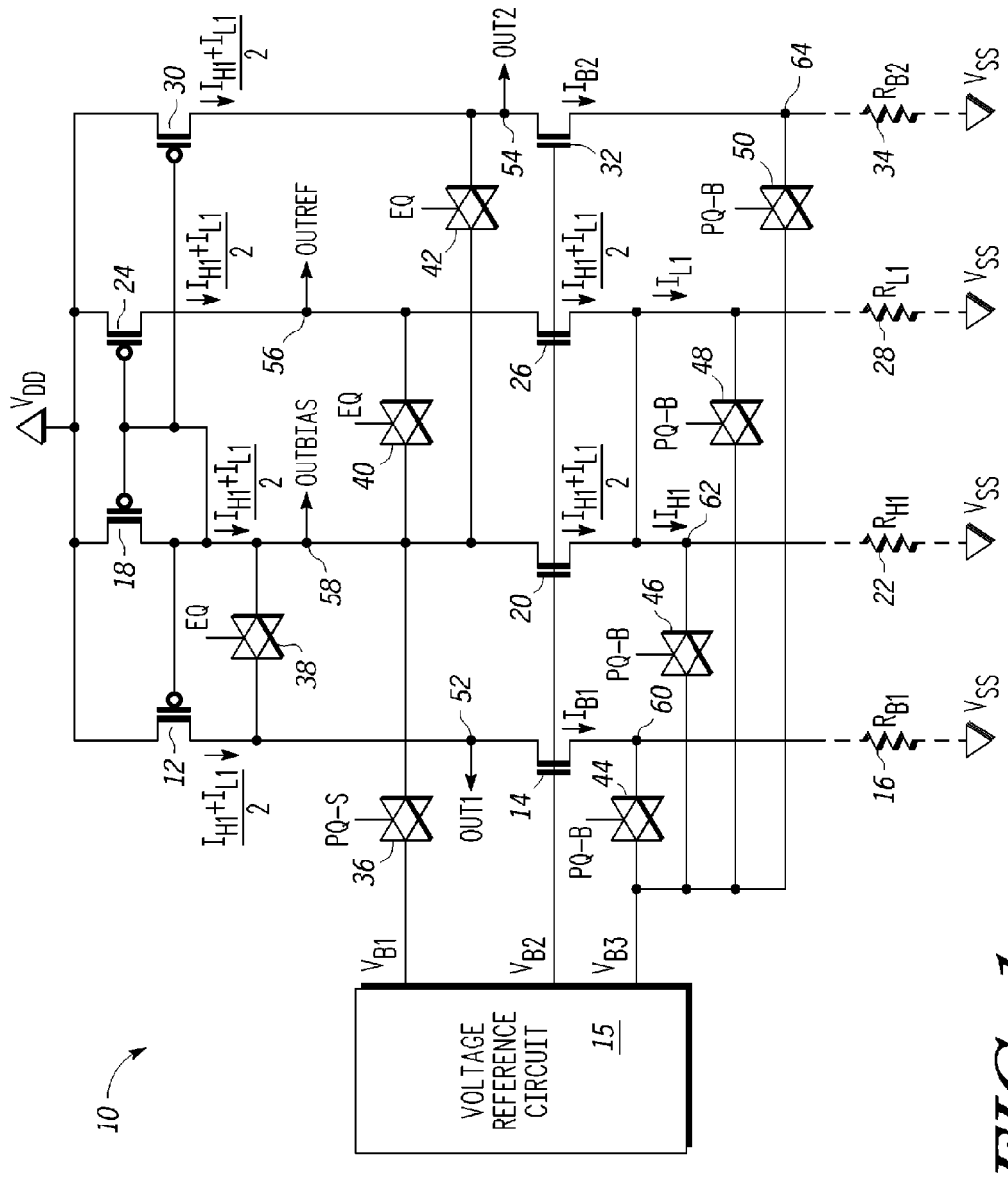
FIG. 1 is a schematic diagram of an exemplary sense amplifier with an exemplary voltage reference circuit, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

By way of a non-limiting example, a memory circuit includes a sense amplifier in which a single reference signal is compared to two data signals from two memory cells. The reference signal is generated from the combination of memory cells in opposite logic states. In addition, the data signal capacitance is matched to the reference signal capacitance. With matched capacitance both high speed and high sensitivity can be achieved.

In one aspect, a memory circuit including a reference voltage circuit is provided. The reference voltage circuit may include a first transistor having a first current electrode coupled to a first power supply terminal, a control electrode for receiving a first bias voltage, and a second current electrode, wherein the first transistor is of a first conductivity type. The reference voltage circuit may further include a second transistor having a first current electrode coupled to the second current electrode of the first transistor, a control electrode for receiving a second bias voltage, and a second current electrode, wherein the second transistor is of a second conductivity type. The reference voltage circuit may further include a third transistor having a first current electrode coupled to the second current electrode of the first transistor, a control electrode for receiving the second bias voltage, and a second current electrode, wherein the third transistor is of the second conductivity type. The reference voltage circuit may further include a first reference memory cell having a first terminal coupled to the second current electrode of the second transistor and second terminal coupled to a second power supply terminal, wherein the first reference memory cell is programmed to a first logic state. The reference voltage circuit may further include a second reference memory cell having a first terminal coupled to the second current electrode of the third transistor and second terminal coupled to the second power supply terminal, wherein the second reference memory cell is programmed to a second logic state.

In addition to the reference voltage circuit, the memory circuit may further include a fourth transistor having a first current electrode coupled to the first power supply terminal, a control electrode for receiving the first bias voltage, and a second current electrode, wherein the fourth transistor is of the first conductivity type. The memory circuit may further include a fifth transistor having a first current electrode coupled to the second current electrode of the fourth transistor, a control electrode for receiving the second bias voltage, and a second current electrode, wherein the fifth transistor is of the second conductivity type. The memory circuit may further include a first memory cell having a first terminal coupled to the second current electrode of the fifth transistor and a second terminal coupled to the second power supply terminal. The memory circuit may further include a sixth transistor having a first current electrode coupled to the first power supply terminal, a gate electrode for receiving the first bias voltage, and a second current electrode, wherein the sixth transistor is of the first conductivity type. The memory circuit may further include a seventh transistor having a first current electrode coupled to the second current electrode of the sixth transistor, a control electrode for receiving the second bias voltage, and a second current electrode, wherein the seventh transistor is of the second conductivity type. The memory circuit may further include a second memory cell having a first terminal coupled to the second current electrode of the seventh transistor and a second terminal coupled to the second power supply terminal. The memory circuit may further include a first comparator having a first input coupled to the second current electrode of the first transistor, a second input coupled to the second current electrode of the fourth transistor, and an output for providing a signal representative of a logic state of the first memory cell. The memory circuit may further include a second comparator having a first input coupled to the second current electrode of the first transistor, a second input coupled to the second current electrode of the sixth transistor, and an output for providing a signal representative of a logic state of the second memory cell.

In another aspect, a memory circuit including a reference voltage circuit is provided. The reference voltage circuit may include a first transistor having a first current electrode coupled to a first power supply terminal and a control electrode and a second current electrode coupled together, wherein the first transistor is of a first conductivity type. The reference voltage circuit may further include a second transistor having a first current electrode coupled to a first power supply terminal, a control electrode coupled to the control electrode of the first transistor, and a second current electrode, wherein the second transistor is of the first conductivity type. The reference voltage circuit may further include a third transistor having a first current electrode coupled to the second current electrode of the first transistor, a control electrode for receiving a first bias voltage, and a second current electrode, wherein the third transistor is of a second conductivity type. The reference voltage circuit may further include a fourth transistor having a first current electrode coupled to the second current electrode of the second transistor, a control electrode for receiving the first bias voltage, and a second current electrode coupled to the second current electrode of the third transistor, wherein the fourth transistor is of the second conductivity type. The reference voltage circuit may further include a first reference memory cell having a first terminal coupled to the second current electrode of the third transistor and second terminal coupled to a second power supply terminal, wherein the first reference memory cell is programmed to a first logic state. The reference voltage circuit may further include a second reference memory cell having a first terminal coupled to the second current electrode of the third transistor and second terminal coupled to the second power supply terminal, wherein the second reference memory cell is programmed to a second logic state.

In addition to the reference voltage circuit, the memory circuit may further include a fifth transistor having a first current electrode coupled to the first power supply terminal, a control electrode coupled to the control electrode of the first transistor, and a second current electrode, wherein the fifth transistor is of the first conductivity type. The memory circuit may further include a sixth transistor having a first current electrode coupled to the second current electrode of the fifth transistor, a control electrode for receiving the first bias voltage, and a second current electrode, wherein the sixth transistor is of the second conductivity type. The memory circuit may further include a first memory cell having a first terminal coupled to the second current electrode of the sixth transistor and a second terminal coupled to the second power supply terminal. The memory circuit may further include a seventh transistor having a first current electrode coupled to the first power supply terminal, a control electrode coupled to the control electrode of the first transistor, and a second current electrode, wherein the seventh transistor is of the first conductivity type. The memory circuit may further include an eighth transistor having a first current electrode coupled to the second current electrode of the seventh transistor, a control electrode for receiving the first bias voltage, and a second current electrode, wherein the eighth transistor is of the second conductivity type. The memory circuit may further include a second memory cell having a first terminal coupled to the second current electrode of the eighth transistor and a second terminal coupled to the second power supply terminal. The memory circuit may further include a first comparator having a first input coupled to the second current electrode of the first transistor, a second input coupled to the second current electrode of the fifth transistor, and an output for providing a signal representative of a logic state of the first memory cell. The memory circuit may further include a second comparator having a first input coupled to the second current electrode of the second transistor, a second input coupled to the second current electrode of the seventh transistor, and an output for providing a signal representative of the logic state of the second memory cell.

In yet another aspect, a memory circuit including a reference memory circuit is provided. The reference memory circuit may include a first transistor having a first current electrode coupled to a first power supply terminal and a control electrode and a second current electrode coupled together, wherein the first transistor is of a first conductivity type. The reference memory circuit may further include a second transistor having a first current electrode coupled to a first power supply terminal, a control electrode coupled to the control electrode of the first transistor, and a second current electrode, wherein the second transistor is of the first conductivity type. The reference memory circuit may further include a third transistor having a first current electrode coupled to the second current electrode of the first transistor, a control electrode for receiving a first bias voltage, and a second current electrode, wherein the third transistor is of a second conductivity type. The reference memory circuit may further include a fourth transistor having a first current electrode coupled to the second current electrode of the second transistor, a control electrode for receiving the first bias voltage, and a second current electrode coupled to the second current electrode of the third transistor, wherein the fourth transistor is of the second conductivity type. The reference memory circuit may further include a first reference memory cell having a first terminal coupled to the second current electrode of the third transistor and second terminal coupled to a second power supply terminal, wherein the first reference memory cell is programmed to a first logic state.

The reference memory circuit may further include a fifth transistor having a first current electrode coupled to the first power supply terminal, a control electrode and a second current electrode coupled together and coupled to the control electrode of the first transistor, wherein the fifth transistor is of the first conductivity type. The reference memory circuit may further include a sixth transistor having a first current electrode coupled to a first power supply terminal, a control electrode coupled to the control electrode of the first transistor, and a second current electrode, wherein the sixth transistor is of the first conductivity type. The reference memory circuit may further include a seventh transistor having a first current electrode coupled to the second current electrode of the fifth transistor, a control electrode for receiving the first bias voltage, and a second current electrode, wherein the seventh transistor is of the second conductivity type. The reference memory circuit may further include an eighth transistor having a first current electrode coupled to the second current electrode of the sixth transistor, a control electrode for receiving the first bias voltage, and a second current electrode coupled to the second current electrode of the seventh transistor, wherein the eighth transistor is of the second conductivity type. The reference memory circuit may further include a second reference memory cell having a first terminal coupled to the second current electrode of the seventh transistor and second terminal coupled to the second power supply terminal, wherein the second reference memory cell is programmed to a second logic state.

In addition to the reference memory circuit, the memory circuit may further include a ninth transistor having a first current electrode coupled to the first power supply terminal, a control electrode coupled to the control electrode of the first transistor, and a second current electrode, wherein the ninth transistor is of the first conductivity type. The memory circuit may further include a tenth transistor having a first current electrode coupled to the second current electrode of the ninth transistor, a control electrode for receiving the first bias voltage, and a second current electrode, wherein the tenth transistor is of the second conductivity type. The memory circuit may further include an eleventh transistor having a first current electrode coupled to the first power supply terminal, a control electrode coupled to the control electrode of the first transistor, and a second current electrode, wherein the eleventh transistor is of the first conductivity type. The memory circuit may further include a twelfth transistor having a first current electrode coupled to the second current electrode of the eleventh transistor, a control electrode for receiving the first bias voltage, and a second current electrode coupled to the second current electrode of the tenth transistor, wherein the twelfth transistor is of the second conductivity type. The memory circuit may further include a first memory cell having a first terminal coupled to the second current electrode of the tenth transistor and a second terminal coupled to the second power supply terminal.

The memory circuit may further include a thirteenth transistor having a first current electrode coupled to the first power supply terminal, a control electrode coupled to the control electrode of the first transistor, and a second current electrode, wherein the thirteenth transistor is of the first conductivity type. The memory circuit may further include a fourteenth transistor having a first current electrode coupled to the second current electrode of the thirteenth transistor, a control electrode for receiving the first bias voltage, and a second current electrode, wherein the fourteenth transistor is of the second conductivity type. The memory circuit may further include a fifteenth transistor having a first current electrode coupled to the first power supply terminal, a control electrode coupled to the control electrode of the first transistor, and a second current electrode, wherein the fifteenth transistor is of the first conductivity type. The memory circuit may further include a sixteenth transistor having a first current electrode coupled to the second current electrode of the fifteenth transistor, a control electrode for receiving the first bias voltage, and a second current electrode coupled to the second current electrode of the fourteenth transistor, wherein the sixteenth transistor is of the second conductivity type. The memory circuit may further include a second memory cell having a first terminal coupled to the second current electrode of the fourteenth transistor and a second terminal coupled to the second power supply terminal. The memory circuit may further include a first comparator having a first input coupled to the second current electrode of the second transistor, a second input coupled to the second current electrode of the eleventh transistor, and an output for providing a signal representative of a logic state of the first memory cell. The memory circuit may further include a second comparator having a first input coupled to the second current electrode of the sixth transistor, a second input coupled to the second current electrode of the fifteenth transistor, and an output for providing a signal representative of the logic state of the second memory cell.

FIG. 1 is a schematic diagram of an exemplary sense amplifier 10 with a voltage reference circuit 15. Sense amplifier 10 may be used to sense the state of two bitcells of a memory with bitcells having at least two distinct resistance states, such as a MRAM. Voltage reference circuit 15 may generate three gate bias voltages, $V_{B1}$, $V_{B2}$, and $V_{B3}$. Sense amplifier 10 may include a p-channel transistor 12 with its source connected to a $V_{DD}$ voltage terminal, a gate, and a drain connected to a drain of an n-channel transistor 14 at an output node 52 (producing output OUT1). A gate of transistor 14 may be connected to bias voltage $V_{B2}$. A source of transistor 14 may be connected to node 60 and coupled via one or more coupling devices (not shown), such as a column decoder to a first terminal of a first bit resistance $R_{B1}$ 16. A second terminal of first bit resistance $R_{B1}$ 16 may be coupled via one or more coupling devices (not shown) to a $V_{SS}$ terminal. Sense amplifier 10 may further include a p-channel transistor 18 with its source connected to the $V_{DD}$ voltage terminal. A gate of transistor 18 may be connected to the gate of transistor 12 and to a drain of transistor 18. The drain of transistor 18 may be connected to a drain of an n-channel transistor 20 at an output node 58 (producing output OUT-BIAS). A gate of transistor 20 may be connected to bias voltage $V_{B2}$. A switch 38, such as a transmission gate may be connected between the drain of transistor 12 and node 58. Switch 38 is controlled by an equalization control signal EQ. A source of transistor 20 may be connected to node 62 and coupled via one or more coupling devices (not shown), such as a column decoder to a first terminal of a first high reference resistance $R_{H1}$ 22. A second terminal of first high reference resistance $R_{H1}$ 22 may be coupled via one or more coupling devices (not shown) to the $V_{SS}$ terminal.

Referring still to FIG. 1, sense amplifier 10 may further include a p-channel transistor 24 with its source connected to the $V_{DD}$ voltage terminal. A drain of transistor 24 may be connected to a drain of an n-channel transistor 26 at an output node 56 (producing output OUTREF). A gate of transistor 24 may be connected to the gate of transistor 18. A gate of transistor 26 may be coupled to bias voltage $V_{B2}$. A source of transistor 26 may be connected to the source of transistor 20 and be coupled via one or more coupling devices (not shown), such as a column decoder to a first terminal of a first low reference resistance $R_{L1}$ 28. A second terminal of first low reference resistance $R_{L1}$ 28 may be coupled via one or more coupling devices (not shown) to $V_{SS}$ voltage terminal. A switch 40, such as a transmission gate may be connected between node 58 and node 56. Switch 40 is controlled by an equalization control signal EQ. Sense amplifier 10 may further include a p-channel transistor 30 with its source connected to the $V_{DD}$ voltage terminal. A drain of transistor 30 may be connected to a drain of an n-channel transistor 32 at an output node 54 (producing output OUT2). A gate of transistor 30 may be connected to node 58 and a gate of transistor 26 may be coupled to bias voltage $V_{B2}$. A source of transistor 32 may be connected to node 64 and coupled via one or more coupling devices (not shown), such as a column decoder to a first terminal of a second bit resistance $R_{B2}$ 34. A second terminal of second bit resistance $R_{B2}$ 34 may be coupled via one or more coupling devices (not shown) to the $V_{SS}$ terminal. A switch 42, such as a transmission gate may be connected between node 58 and node 54. Switch 42 is controlled by an equalization control signal EQ.

Referring still to FIG. 1, by way of example, a switch 36 has a first terminal connected to voltage reference circuit 15 for receiving voltage $V_{B1}$ and a second terminal connected to node 58. Switch 36 is controlled by a precharge control signal PQ-S. A switch 44 has a first terminal connected to voltage reference circuit 15 for receiving voltage $V_{B3}$ and a second terminal connected to node 60. Switch 44 is controlled by a precharge control signal PQ-B. A switch 46 has a first terminal connected to voltage reference circuit 15 for receiving voltage $V_{B3}$ and a second terminal connected to node 62. Switch 46 is controlled by a precharge control signal PQ-B. A switch 48 has a first terminal connected to voltage reference circuit 15 for receiving voltage $V_{B3}$ and a second terminal connected to node 62. Switch 48 is controlled by a precharge control signal PQ-B. A switch 50 has a first terminal connected to voltage reference circuit 15 for receiving voltage $V_{B3}$ and a second terminal connected to node 64. Switch 50 is controlled by a precharge control signal PQ-B. Voltage $V_{B3}$ is used to precharge nodes 60, 62, and 64 to a value close to their steady state values.

In operation, sense amplifier 10 senses a state of two memory cells, each represented by resistance $R_{B1}$ 16 and resistance $R_{B2}$ 34. Each of resistance $R_{B1}$ 16 and resistance $R_{B2}$ 34 is programmable to a high resistance state or a low resistance state. Bias voltage $V_{B2}$ places a fixed voltage on the gates of transistors 14, 20, 26, and 32, each of which operates as a source-follower and thereby placing a fixed voltage at nodes 60, 62, and 64. Presence of the fixed voltage at nodes 60, 62, and 64 generates current through resistances $R_{B1}$ 16, $R_{H1}$ 22, $R_{L1}$ 28, and $R_{B2}$ 34. By way of example, current $I_{B1}$ flows through $R_{B1}$ 16, current $I_{H1}$ flows through $R_{H1}$ 22, current $I_{L1}$ flows through $R_{L1}$ 28, and current $I_{B2}$ flows through $R_{B2}$ 34. Current $I_{B1}$ also flows through transistor 14. Current $I_{B2}$ also flows through transistor 32. Because transistors 20 and 26 are matched, each carries the same amount of current, i.e., $(I_{H1}+I_{L1})/2$. The current flowing through transistor 20 flows through diode connected transistor 18 establishing bias voltage OUTBIAS at node 58. Transistors 12, 24, and 30 match transistor 18 and form a current mirror with transistor 18. Transistors 24 and 26 carry substantially the same current $(I_{H1}+I_{L1})/2$ and thereby establishing a common reference voltage OUTREF at node 56. In other words, current $(I_{H1}+I_{L1})/2$ flows through transistors 12, 24, 18, and 30. The voltage at node 52 (labeled as OUT1) will represent the difference between current flowing through transistor 12 and transistor 14. Similarly, the voltage at node 54 (labeled as OUT2) will represent the difference between current flowing through transistor 30 and transistor 32. If resistance $R_{B1}$ is in a low-resistance state (substantially equal to resistance $R_{L1}$), then the current flowing through resistance $R_{B1}$ would be higher than $(I_{H1}+I_{L1})/2$. On the other hand, if resistance $R_{B1}$ is in a high-resistance state (substantially equal to resistance $R_{H1}$), then the current flowing through resistance $R_{B1}$ would be lower than $(I_{H1}+I_{L1})/2$. If resistance $R_{B2}$ is in a low-resistance state (substantially equal to resistance $R_{L1}$), then the current flowing through resistance $R_{B2}$ would be higher than $(I_{H1}+I_{L1})/2$. On the other hand, if resistance $R_{B2}$ is in a high-resistance state (substantially equal to resistance $R_{H1}$), then the current flowing through resistance $R_{B2}$ would be lower than $(IH_1+IL_1)/2$. Thus, OUT1 and OUT2 reflect the state of two bitcells. By way of example, when resistance RBI is in a low-resistance state, the steady state voltage of the OUT1 signal at node 52 would be lower than the reference voltage OUTREF. On the other hand, when resistance $R_{B1}$ is in a high-resistance state, the steady state voltage of the OUT1 signal at node 52 would be higher than the reference voltage OUTREF. In an analogous manner, when resistance $R_{B2}$ is in a low-resistance state, the steady state voltage of the OUT2 signal at node 54 would be lower than the reference voltage OUTREF. On the other hand, when resistance $R_{B2}$ is in a high-resistance state, the steady state voltage of the OUT2 signal at node 54 would be higher than the reference voltage OUTREF.

Referring still to FIG. 1, in operation, the use of precharge switches 36, 44, 46, 48, and 50 reduces the time required to charge capacitance associated with nodes 58, 60, 62 and 64. The use of equalization switches 38, 40, and 42 equalizes the voltage at nodes 52, 54, and 56 to the voltage at node 58 and thereby initializing sense amplifier 10 for sensing of the state of the data bits.

Figure 2:
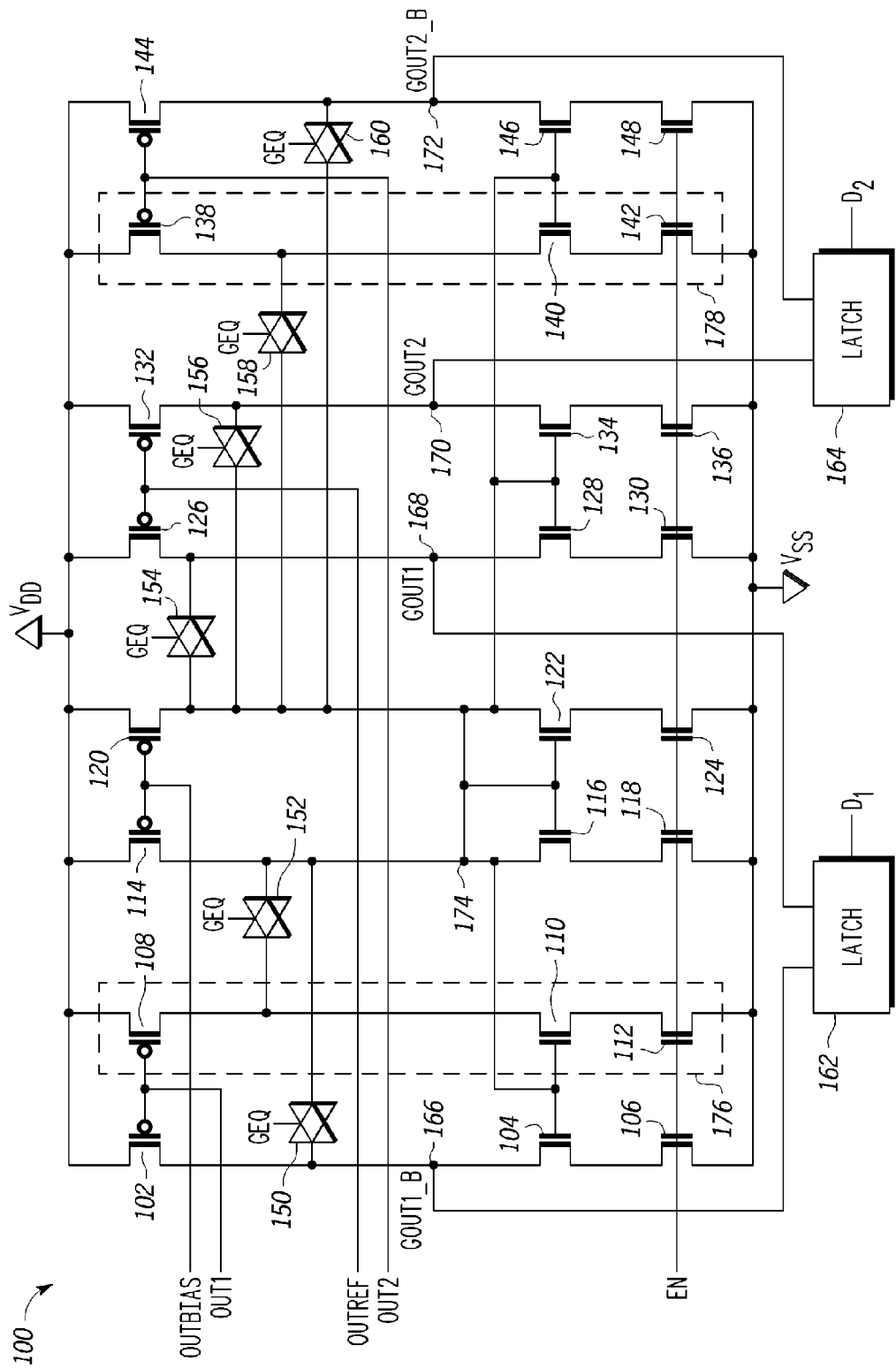
FIG. 2 is a schematic diagram of an exemplary gain stage for the sense amplifier of FIG. 1, consistent with one embodiment of the invention.

Referring now to FIG. 2, a schematic diagram of an exemplary gain stage 100 for a sense amplifier (e.g., 10 of FIG. 1) is shown. Gain stage 100 may receive output signals OUTBIAS, OUT1, OUT2, and OUTREF from sense amplifier 10 of FIG. 1 and amplify them. Gain stage 100 may include a p-channel transistor 102 with its source connected to a $V_{DD}$ voltage terminal. A drain of transistor 102 may be connected to a drain of an n-channel transistor 104 at an output node 166 (producing output GOUT1_B). A source of transistor 104 may be connected to a drain of an n-channel transistor 106. A source of transistor 106 may be coupled to a $V_{SS}$ terminal. Gain stage 100 may further include a p-channel transistor 108 with its source connected to the $V_{DD}$ voltage terminal. A drain of transistor 108 may be connected to a drain of an n-channel transistor 110 and a source of transistor 110 may be connected to a drain of an n-channel transistor 112. A source of transistor 112 may be coupled to the $V_{SS}$ terminal. A gate of transistor 102 may be coupled a gate of transistor 108 and both of the gates may be coupled to voltage OUT1. Gain stage 100 may further include a p-channel transistor 114 with its source connected to the $V_{DD}$ voltage terminal. A drain of transistor 114 may be connected to a drain of an n-channel transistor 116 at node 174 and may further be connected to a gate of transistor 104 and to a gate of transistor 110. A source of transistor 116 may be connected to a drain of an n-channel transistor 118. A source of transistor 118 may be coupled to a $V_{SS}$ terminal. Gain stage 100 may further include a p-channel transistor 120 with its source connected to the $V_{DD}$ voltage terminal. A drain of transistor 120 may be connected to the drain of transistor 114 and to a drain of an n-channel transistor 122 at node 174. A source of transistor 122 may be connected to a drain of an n-channel transistor 124. A source of transistor 124 may be coupled to the $V_{SS}$ terminal. A gate of transistor 114 may be coupled a gate of transistor 120 and both of the gates may be coupled to bias voltage OUTBIAS. A gate of transistor 116 may be coupled to a gate of transistor 122 and may further be coupled to the drain of transistor 114 at node 174.

Referring still to FIG. 2, gain stage 100 may include a p-channel transistor 126 with its source connected to the $V_{DD}$ voltage terminal. A drain of transistor 126 may be connected to a drain of an n-channel transistor 128 at an output node 168 (producing output GOUT1). A source of transistor 128 may be connected to a drain of an n-channel transistor 130. A source of transistor 130 may be coupled to the $V_{SS}$ terminal. Gain stage 100 may further include a p-channel transistor 132 with its source connected to the $V_{DD}$ voltage terminal. A drain of transistor 132 may be connected to a drain of an n-channel transistor 134 at node 170 (providing voltage GOUT2). A source of transistor 134 may be connected to a drain of an n-channel transistor 136. A source of transistor 136 may be coupled to the $V_{SS}$ terminal. Voltage OUTREF may be coupled to gates of transistors 126 and 132. Gain stage 100 may further include a p-channel transistor 138 with its source connected to the $V_{DD}$ voltage terminal. A drain of transistor 138 may be connected to a drain of an n-channel transistor 140. A source of transistor 140 may be connected to a drain of an n-channel transistor 142. A source of transistor 142 may be coupled to the $V_{SS}$ terminal. Gain stage 100 may further include a p-channel transistor 144 with its source connected to the $V_{DD}$ voltage terminal. A drain of transistor 144 may be connected to a drain of an n-channel transistor 146 at node 172 (providing voltage GOUT2_B). A source of transistor 146 may be connected to a drain of an n-channel transistor 148. A source of transistor 148 may be coupled to the $V_{SS}$ terminal. A gate of transistor 138 may be coupled to a gate of transistor 144 and both of the gates may be coupled to bias voltage OUT2. A gate of transistor 128 may be coupled to a gate of transistor 134 and both of the gates may be coupled to the drain of transistor 114 at node 174 and further to a gate of transistor 140 and a gate of transistor 146. An enable signal EN may be connected to the gates of transistors 106, 112, 118, 124, 130, 136, 142, and 148, such that they could be turned on or off based on the status of the enable signal.

Referring still to FIG. 2, node 166 may be coupled to one input of latch 162 and node 168 may be coupled to another input of latch 162, which provides output $D_1$. Node 170 may be coupled to one input of latch 164 and node 172 may be coupled to another input of latch 164, which provides output $D_2$.

In operation, gain stage 100 of FIG. 2 may be used to amplify the signals output by sense amplifier 10 of FIG. 1. The enable signal EN turns on transistors 106, 112, 118, 124, 130, 136, 142, and 148 and thereby connecting the source terminals of transistors 104, 110, 116, 122, 128, 134, 140, and 146 to the $V_{SS}$ terminal. The application of bias voltage OUTBIAS to the gates of transistors 114 and 120 generates current through transistors 114 and 120. The current through transistors 114 and 120 flows through diode connected transistors 116 and 122, thereby establishing a voltage at node 174. The voltage at node 174 biases transistors 104, 110, 128, 134, 140, and 146. Voltage OUT1 biases transistors 102 and 108 establishing currents through these transistors. Transistors shown in FIGS. 1 and 2 may be sized appropriately to get the right amount of gain and performance. Voltage GOUT1_B represents the difference between current flowing through transistors 102 and 104. Similarly, voltage GOUT1 represents the difference between current flowing through transistors 126 and 128. Latch 162, which may be a cross-coupled latch amplifies a difference between voltage GOUT1_B and GOUT1. Thus, latch 162 generates a data bit $D_1$ corresponding to one bit of a memory having at least two different resistance states. A second data bit $D_2$ is generated by latch 164 by amplifying the difference between voltage GOUT2 and GOUT2_B similar to latch 162. In operation, portion 176 of gain stage 100 relates to a dummy load for voltage OUT1 and portion 178 of gain stage 100 relates to a dummy load for voltage OUT2. The presence of these dummy loads balances the load on voltage OUT1 and voltage OUT2 relative to the load on reference voltage OUTREF. Although FIG. 2 shows a specific implementation of dummy loads to balance different voltages, other arrangements may be used to balance different voltages.

Figure 3:
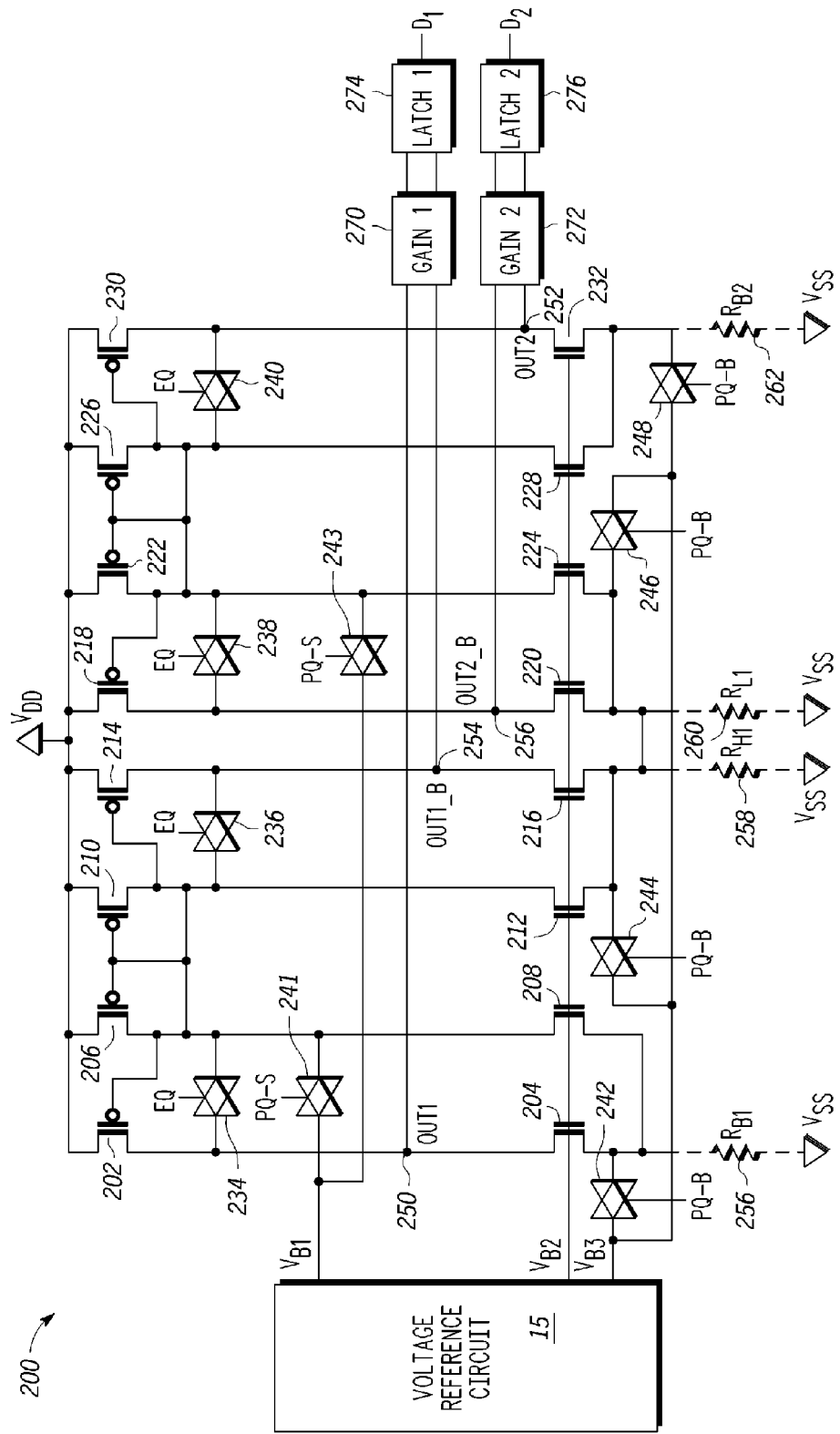
FIG. 3 is a schematic diagram of an exemplary sense amplifier with an exemplary voltage reference circuit, consistent with one embodiment of the invention.

FIG. 3 is a schematic diagram of an exemplary sense amplifier with an exemplary voltage reference circuit, consistent with one embodiment of the invention. Like sense amplifier 10 of FIG. 1, sense amplifier 200 may be used to sense the state of two bitcells of a memory with bitcells having at least two distinct resistance states, such as a MRAM. Voltage reference circuit 15 may generate three gate bias voltages, $V_{B1}$, $V_{B2}$, and $V_{B3}$. Sense amplifier 200 may include a p-channel transistor 202 with its source connected to a $V_{DD}$ voltage terminal. A drain of transistor 202 may be connected to a drain of an n-channel transistor 204 at an output node 250 (producing output OUT1). A gate of transistor 204 may be connected to bias voltage $V_{B2}$. A source of transistor 204 may be coupled via one or more coupling devices (not shown), such as a column decoder to a first terminal of a first bit resistance $R_{B1}$ 256. A second terminal of first bit resistance $R_{B1}$ 256 may be coupled via one or more coupling devices (not shown) to the $V_{SS}$ terminal. Sense amplifier 200 may further include a p-channel transistor 206 with its source connected to the $V_{DD}$ voltage terminal. A drain of transistor 206 may be connected to a drain of an n-channel transistor 208. A gate of transistor 208 may be connected to bias voltage $V_{B2}$. A switch 234, such as a transmission gate may be connected between the drain of transistor 202 and the drain of transistor 206. Switch 234 is controlled by an equalization control signal EQ. A source of transistor 208 may be connected to the source of transistor 204. Sense amplifier 200 may further include a p-channel transistor 210 with its source connected to the $V_{DD}$ voltage terminal. A drain of transistor 210 may be connected to a drain of an n-channel transistor 212. A gate of transistor 210 may be connected to the gate of transistor 206 and to the drain of transistor 206 and to the drain of transistor 210 and to the gate of transistor 202. A gate of transistor 212 may be connected to bias voltage $V_{B2}$. A source of transistor 212 may be coupled via one or more coupling devices (not shown), such as a column decoder to the first terminal of a first high reference resistance $R_{H1}$ 258. A second terminal of first high reference resistance $R_{H1}$ 258 may be coupled via one or more coupling devices (not shown) to the $V_{SS}$ terminal.

Referring still to FIG. 3, sense amplifier 200 may further include a p-channel transistor 214 with it source connected to the $V_{DD}$ voltage terminal. A drain of transistor 214 may be connected to a drain of an n-channel transistor 216 at an output node 254 (producing output OUT1_B). A gate of transistor 214 may be coupled to the drain of transistor 210. A switch 236, such as a transmission gate may be connected between the drain of transistor 210 and the drain of transistor 214. Switch 236 is controlled by an equalization control signal EQ. A source of transistor 216 may be connected to the source of transistor 212. A gate of transistor 212 may be connected to bias voltage $V_{B2}$. A gate of transistor 216 may be connected to bias voltage $V_{B2}$. Sense amplifier 200 may further include a p-channel transistor 218 with it source connected to the $V_{DD}$ voltage terminal. A drain of transistor 218 may be connected to a drain of an n-channel transistor 220 at node 256 (producing output OUT2_B). A gate of transistor 220 may be connected to bias voltage $V_{B2}$. A source of transistor 220 may be connected to the source of transistor 216 and may be coupled via one or more coupling devices (not shown), such as a column decoder to the first terminal of first low reference resistance $R_{L1}$ 260. A second terminal of first low reference resistance $R_{L1}$ 260 may be coupled via one or more coupling devices (not shown) to the $V_{SS}$ terminal. Sense amplifier 200 may further include a p-channel transistor 222 with it source connected to the $V_{DD}$ voltage terminal. A drain of transistor 222 may be connected to a drain of an n-channel transistor 224. A switch 238, such as a transmission gate may be connected between the drain of transistor 218 and the drain of transistor 222. Switch 238 is controlled by an equalization control signal EQ. A gate of transistor 224 may be connected to bias voltage $V_{B2}$. A source of transistor 224 may be connected to the source of transistor 220.

Sense amplifier 200 may further include a p-channel transistor 226 with its source connected to the $V_{DD}$ voltage terminal. A drain of transistor 226 may be connected to a drain of an n-channel transistor 228. A gate of transistor 226 may be connected to the gate of transistor 222 and to the gate of transistor 218, and may further be connected to the drain of transistor 222 and to the drain of transistor 226. A source of transistor 228 may be coupled via one or more coupling devices (not shown), such as a column decoder to a first terminal of a second bit resistance $R_{B2}$ 262. A second terminal of second bit resistance $R_{B2}$ 262 may be coupled via one or more coupling devices (not shown) to the $V_{SS}$ terminal. Sense amplifier 200 may further include a p-channel transistor 230 with its source connected to the $V_{DD}$ voltage terminal. A gate of transistor 230 may be connected to the drain of transistor 226. A drain of transistor 230 may be connected to a drain of an n-channel transistor 232 at an output node 252 (producing output OUT2). A gate of transistor 232 may be connected to bias voltage $V_{B2}$. A source of transistor 232 may be connected to the source of transistor 228. A switch 240, such as a transmission gate may be connected between the drain of transistor 226 and the drain of transistor 230. Switch 240 is controlled by an equalization control signal EQ.

Referring still to FIG. 3, by way of example, a switch 241 has a first terminal connected to voltage reference circuit 15 for receiving voltage $V_{B1}$ and a second terminal connected to a node formed by the coupling of the drain of transistor 206 and the drain of transistor 208. Another switch 243 has a first terminal connected to voltage reference circuit 15 for receiving voltage $V_{B1}$ and a second terminal connected to a node formed by the coupling of the drain of transistor 222 and the drain of transistor 224. Switches 241 and 243 are controlled by a precharge control signal PQ-S. A switch 242 has a first terminal connected to voltage reference circuit 15 for receiving voltage $V_{B3}$ and a second terminal connected to the source of transistor 204. Another switch 244 has a first terminal connected to voltage reference circuit 15 for receiving voltage $V_{B3}$ and a second terminal connected to the source of transistor 212. Another switch 246 has a first terminal connected to voltage reference circuit 15 for receiving voltage $V_{B3}$ and a second terminal connected to the source of transistor 224. Another switch 248 has a first terminal connected to voltage reference circuit 15 for receiving voltage $V_{B3}$ and a second terminal connected to the source of transistor 232. Switches 242, 244, 246, and 248 are controlled by a precharge control signal PQ-B.

Referring still to FIG. 3, by way of example, sense amplifier 200 may further include a gain stage GAIN 1 270 for receiving voltage OUT1 from node 250 and voltage OUT1_B from node 254. The output of gain stage GAIN 1 270 may be coupled to a latch stage LATCH 1 274 for storing a first bit $D_1$. Sense amplifier 200 may further include a gain stage GAIN 2 272 for receiving voltage OUT2 from node 252 and voltage OUT2_B from node 256. The output of gain stage GAIN 2 272 may be coupled to a latch stage LATCH 2 276 for storing a second bit $D_2$.

In operation, sense amplifier 200 is used to sense a state of two memory cells, each represented by resistance $R_{B1}$ 256 and resistance $R_{B2}$ 262. The voltage at node 250 (labeled as OUT1) will represent the difference between current flowing through transistor 202 and transistor 204. Similarly, the voltage at node 252 (labeled as OUT2) will represent the difference between current flowing through transistor 230 and transistor 232. As described above with respect to FIG. 1, if resistance $R_{B1}$ is in a low-resistance state (substantially equal to resistance $R_{H1}$), then the current flowing through resistance $R_{B1}$ would be higher than $(I_{H1}+I_{L1})/2$. On the other hand, if resistance $R_{B1}$ is in a high-resistance state (substantially equal to resistance $R_{H1}$), then the current flowing through resistance $R_{B1}$ would be lower than $(I_{H1}+I_{L1})/2$. If resistance $R_{B2}$ is in a low-resistance state (substantially equal to resistance $R_{L1}$), then the current flowing through resistance $R_{B2}$ would be higher than $(I_{H1}+I_{L1})/2$. On the other hand, if resistance $R_{B2}$ is in a high-resistance state (substantially equal to resistance $R_{H1}$), then the current flowing through resistance $R_{B2}$ would be lower than $(I_{H1}+I_{L1})/2$. Application of bias voltage $V_{B2}$ generates a lower amount of current $I_{H1}$ through resistance $R_{H1}$ 258 and a relatively higher amount of current $I_{L1}$ through resistance $R_{L1}$ 260. Since transistors 212, 216, 220, and 224 match and their gates are tied together and their sources are tied together each of them draws one fourth of the sum of currents $I_{H1}$ and $I_{L1}$. Similarly, since transistors 204 and 208 match and their gates are tied together and their sources are tied together each of them draws one half of current $I_{B1}$ (flowing through resistance $R_{B1}$ 256). Further, since transistors 228 and 232 match and their gates are tied together and their sources are tied together each of them draws one half of current $I_{B2}$ (flowing through resistance $R_{B2}$ 262). Since transistors 206 and 210 match and their sources, gates, and drains are tied together, current $((I_{H1}+I_{L1})/8+I_{B1}/4)$ flows through each of transistors 206 and 210. Similarly, this would result in current $((I_{H1}+I_{L1})/8+I_{B2}/4)$ flowing through each of transistors 222 and 226. Because transistors 202 and 214 are matched to transistors 206 and 210, each carries current $((I_{H1}+I_{L1})/8+I_{B1}/4)$ through it. Similarly, because transistors 218 and 230 are matched to transistors 222 and 226, each carries current $((I_{H1}+I_{L1})/8+I_{B2}/4)$ through it. The voltage at node 250 (OUT1) will represent the difference between current flowing through transistors 202 and 204. By way of example, for the arrangement shown in FIG. 3, the difference would be $((I_{H1}+I_{L1})/8-I_{B1}/4)$. Similarly, the voltage at node 252 (OUT2) will represent the difference between current flowing through transistors 230 and 232. In particular, by way of example, for the arrangement shown in FIG. 3, the difference would be $((I_{H1}+I_{L1})/8-I_{B2}/4)$. Similarly, the voltage at node 254 (OUT1_B) will represent the difference between current flowing through transistors 214 and 216. In particular, by way of example, for the arrangement shown in FIG. 3, the difference would be $(-(I_{H1}+I_{L1})/8+I_{B1}/4)$. Similarly, the voltage at node 256 (OUT2_B) will represent the difference between current flowing through transistors 218 and 220. In particular, by way of example, for the arrangement shown in FIG. 3, the difference would be $(-(I_{H1}+I_{L1})/8+I_{B2}/4)$. By way of example, the outputs generated by sense amplifier 200 may then be processed by gain stages GAIN 1 270, GAIN 2 272, LATCH 1 274, and LATCH 2 276, similar to as described above with respect to FIGS. 1 and 2.

Figure 4:
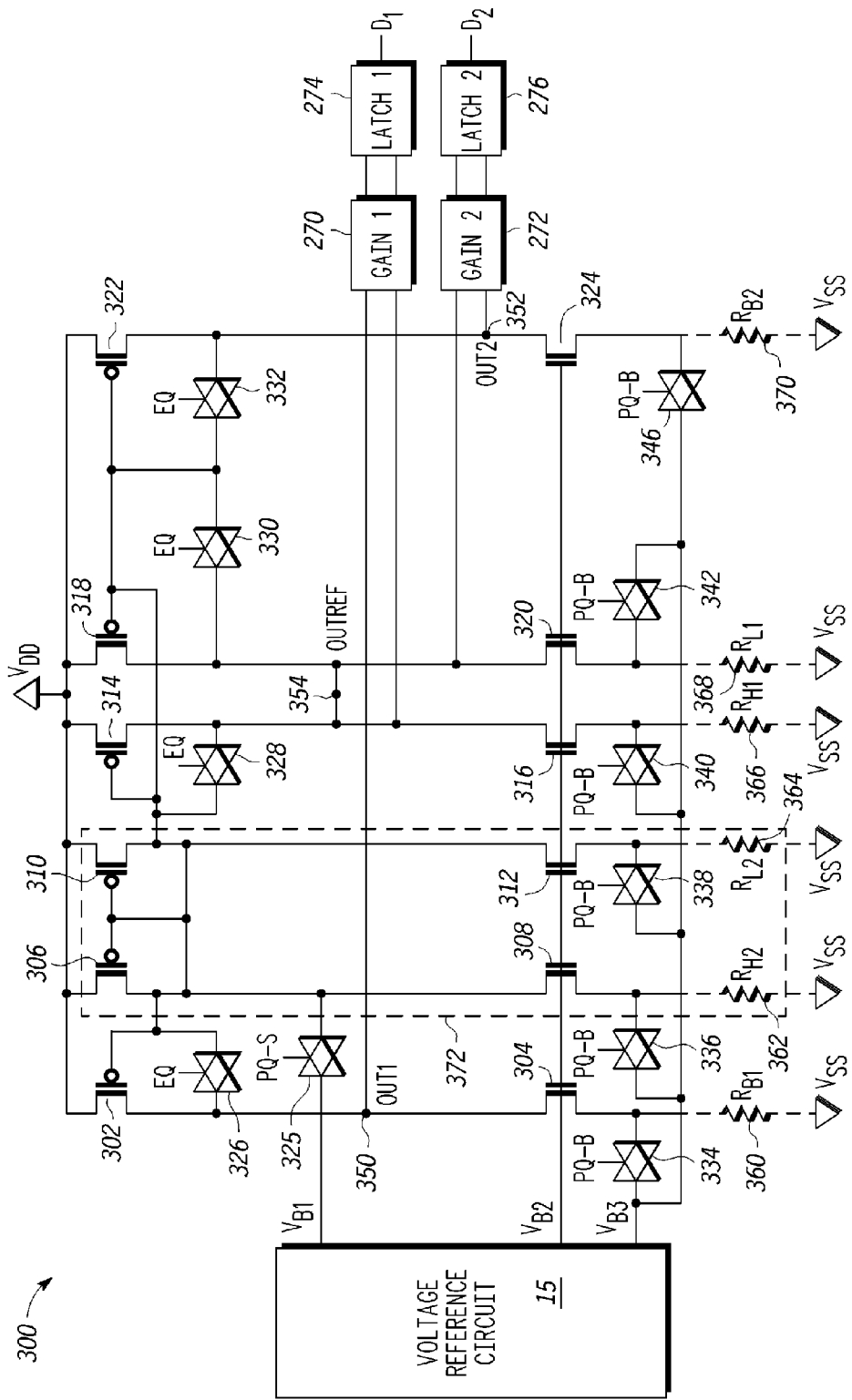
FIG. 4 is a schematic diagram of an exemplary sense amplifier with an exemplary voltage reference circuit, consistent with one embodiment of the invention.

FIG. 4 is a schematic diagram of an exemplary sense amplifier with an exemplary voltage reference circuit, consistent with one embodiment of the invention. Like sense amplifier 10 of FIG. 1 and sense amplifier 200 of FIG. 3, sense amplifier 300 may be used to sense the state of two bitcells of a memory with bitcells having at least two distinct resistance states, such as a MRAM. Voltage reference circuit 15 may generate three gate bias voltages, $V_{B1}$, $V_{B2}$, and $V_{B3}$. Sense amplifier 300 may include a p-channel transistor 302 with its source connected to a $V_{DD}$ voltage terminal. A drain of transistor 302 may be connected to a drain of an n-channel transistor 304 at an output node 350 (producing output OUT1). A gate of transistor 304 may be connected to bias voltage $V_{B2}$. A source of transistor 304 may be coupled via one or more coupling devices (not shown), such as a column decoder to a first terminal of a first bit resistance $R_{B1}$ 360. A second terminal of first bit resistance $R_{B1}$ 360 may be coupled via one or more coupling devices (not shown) to a $V_{SS}$ terminal. Sense amplifier 300 may further include a p-channel transistor 306 with its source connected to the $V_{DD}$ voltage terminal. A drain of transistor 306 may be connected to a drain of an n-channel transistor 308 and to a gate of transistor 306 and to a gate of transistor 302. A gate of transistor 308 may be connected to bias voltage $V_{B2}$. A switch 326, such as a transmission gate may be connected between the drain of transistor 302 and the drain of transistor 306. Switch 326 is controlled by an equalization control signal EQ. A source of transistor 308 may be coupled via one or more coupling devices (not shown), such as a column decoder to a first terminal of a second high reference resistance $R_{H2}$ 362. A second terminal of second high reference resistance $R_{H2}$ 362 may be coupled via one or more coupling devices (not shown) to the $V_{SS}$ terminal. Sense amplifier 300 may further include a p-channel transistor 310 with its source connected to the $V_{DD}$ voltage terminal. A drain of transistor 310 may be connected to a drain of an n-channel transistor 312. A gate of transistor 312 may be connected to bias voltage $V_{B2}$. A gate of transistor 310 may be connected to the drain of transistor 310 and to the drain of transistor 306. A source of transistor 312 may be coupled via one or more coupling devices (not shown), such as a column decoder to the first terminal of a second low reference resistance $R_{L2}$ 364. A second terminal of second low reference resistance $R_{L2}$ 364 may be coupled via one or more coupling devices (not shown) to the $V_{SS}$ terminal.

Referring still to FIG. 4, sense amplifier 300 may further include a p-channel transistor 314 with its source connected to the $V_{DD}$ voltage terminal. A drain of transistor 314 may be connected to a drain of an n-channel transistor 316 at an output node 354 (producing output OUTREF). A gate of transistor 316 may be connected to bias voltage $V_{B2}$. A gate of transistor 314 may be coupled to the drain of transistor 306. A switch 328, such as a transmission gate may be connected between the drain of transistor 310 and the drain of transistor 306. Switch 328 is controlled by an equalization control signal EQ. A source of transistor 316 may be coupled via one or more coupling devices (not shown), such as a column decoder to a first terminal of a first high reference resistance $R_{H1}$ 366. A second terminal of first high reference resistance $R_{H1}$ 366 may be coupled via one or more coupling devices (not shown) to $V_{SS}$ voltage terminal. Sense amplifier 300 may further include a p-channel transistor 318 with its source connected to the $V_{DD}$ voltage terminal. A gate of transistor 318 may be connected to the drain of transistor 306. A drain of transistor 318 may be connected to a drain of an n-channel transistor 320 at node 354 (producing output OUTREF). A gate of transistor 320 may be connected to bias voltage $V_{B2}$. A source of transistor 320 may be coupled via one or more coupling devices (not shown), such as a column decoder to the first terminal of first low reference resistance $R_{L1}$ 368. A second terminal of first low reference resistance $R_{L1}$ 368 may be coupled via one or more coupling devices (not shown) to the $V_{SS}$ terminal. Sense amplifier 300 may further include a p-channel transistor 322 with it source connected to the $V_{DD}$ voltage terminal. A gate of transistor 322 may be connected to the drain of transistor 306. A drain of transistor 322 may be connected to a drain of an n-channel transistor 324 at node 352 (producing output OUT2). A switch 330, such as a transmission gate may be connected between the drain of transistor 318 and the drain of transistor 306. Another switch 332, such as a transmission gate may be connected between the drain of transistor 322 and the drain of transistor 306. Switches 330 and 332 are controlled by an equalization control signal EQ. A gate of transistor 324 may be connected to bias voltage $V_{B2}$. A source of transistor 324 may be coupled via one or more coupling devices (not shown), such as a column decoder to the first terminal of second bit resistance $R_{B2}$ 370. A second terminal of second bit resistance $R_{B2}$ 370 may be coupled via one or more coupling devices (not shown) to the $V_{SS}$ terminal.

Referring still to FIG. 4, by way of example, a switch 325 has a first terminal connected to voltage reference circuit 15 for receiving voltage $V_{B1}$ and a second terminal connected to a node formed by the coupling of the drain of transistor 306 and the drain of transistor 308. Switch 325 is controlled by a precharge control signal PQ-S. A switch 334 has a first terminal connected to voltage reference circuit 15 for receiving voltage $V_{B3}$ and a second terminal connected to the source of transistor 304. Another switch 336 has a first terminal connected to voltage reference circuit 15 for receiving voltage $V_{B3}$ and a second terminal connected to the source of transistor 308. Another switch 338 has a first terminal connected to voltage reference circuit 15 for receiving voltage $V_{B3}$ and a second terminal connected to the source of transistor 312. Another switch 340 has a first terminal connected to voltage reference circuit 15 for receiving voltage $V_{B3}$ and a second terminal connected to the source of transistor 316. Another switch 342 has a first terminal connected to voltage reference circuit 15 for receiving voltage $V_{B3}$ and a second terminal connected to the source of transistor 320. Another switch 346 has a first terminal connected to voltage reference circuit 15 for receiving voltage $V_{B3}$ and a second terminal connected to the source of transistor 324. Switches 334, 336, 338, 340, 342, and 346 are each controlled by a precharge control signal PQ-B. Referring still to FIG. 4, by way of example, sense amplifier 300 may further include two gain stages and two latch stages similar to as described above with respect to FIG. 3 for sense amplifier 200.

In operation, sense amplifier 300 is used to sense a state of two memory cells, each represented by resistance $R_{B1}$ 360 and resistance $R_{B2}$ 370. Portion 372 containing transistors 306, 308, 310, and 312, and further containing reference cells 362 and 364 is used to bias transistors 302, 314, 318, and 322. If current flowing through $R_{H2}$ is labeled as $I_{H2}$ and current flowing through $R_{L2}$ is $I_{L2}$, then the current flowing through transistors 306 and 310 would be $(I_{H2}+I_{L2})/2$, since their gates and drains are tied together, and their sources are tied together. Since transistors 302, 314, 318, and 322 mirror the current flowing through transistors 306 and 310, they each carry $(I_{H2}+I_{L2})/2$. If current flowing through transistor 316 is $I_{H1}$ and current flowing through transistor 320 is $I_{L1}$, then the current into node 354 would be $(I_{H2}+I_{L2})/2+(I_{H2}+I_{L2})/2-I_{H1}-I_{L1}$. Since $I_{L1}$ is substantially equal to $I_{L2}$ and $I_{H1}$ is substantially equal to $I_{H2}$, the current at node 354 would be approximately zero. The voltage at node 354 labeled as OUTREF would act as a reference voltage for the gain stages Gain 1 and Gain 2. The voltage at node 350 (labeled as OUT 1) will represent the difference between current flowing through transistor 302 and transistor 304. Similarly, the voltage at node 352 (labeled as OUT2) will represent the difference between current flowing through transistor 322 and transistor 324. If resistance $R_{B1}$ is in a low-resistance state (substantially equal to resistance $R_{L1}$), then the current flowing through resistance $R_{B1}$ would be higher than $(I_{H2}+I_{L2})/2$. On the other hand, if resistance $R_{B1}$ is in a high-resistance state (substantially equal to resistance $R_{H1}$), then the current flowing through resistance $R_{B1}$ would be lower than $(I_{H2}+I_{L2})/2$. If resistance $R_{B2}$ is in a low-resistance state (substantially equal to resistance $R_{L1}$), then the current flowing through resistance $R_{B2}$ would be higher than $(I_{H2}+I_{L2})/2$. On the other hand, if resistance $R_{B2}$ is in a high-resistance state (substantially equal to resistance $R_{H1}$), then the current flowing through resistance $R_{B2}$ would be lower than $(I_{H2}+I_{L2})/2$. Application of bias voltage $V_{B2}$ generates a lower amount of current $I_{H1}$ through resistance $R_{H1}$ 366 and a relatively higher amount of current $I_{L1}$ through resistance $R_{L1}$ 368. Note that the capacitance at each of node 350 and 352 would be half that of the capacitance at node 354. Thus, each input at each gain stage sees approximately the same capacitance. By way of example, the outputs generated by sense amplifier 300 may then be processed by gain stages (GAIN 1 270, GAIN 2 272) and latches (LATCH 1 274, LATCH 2 276), similar to as described above with respect to FIG. 3.

Figure 5:
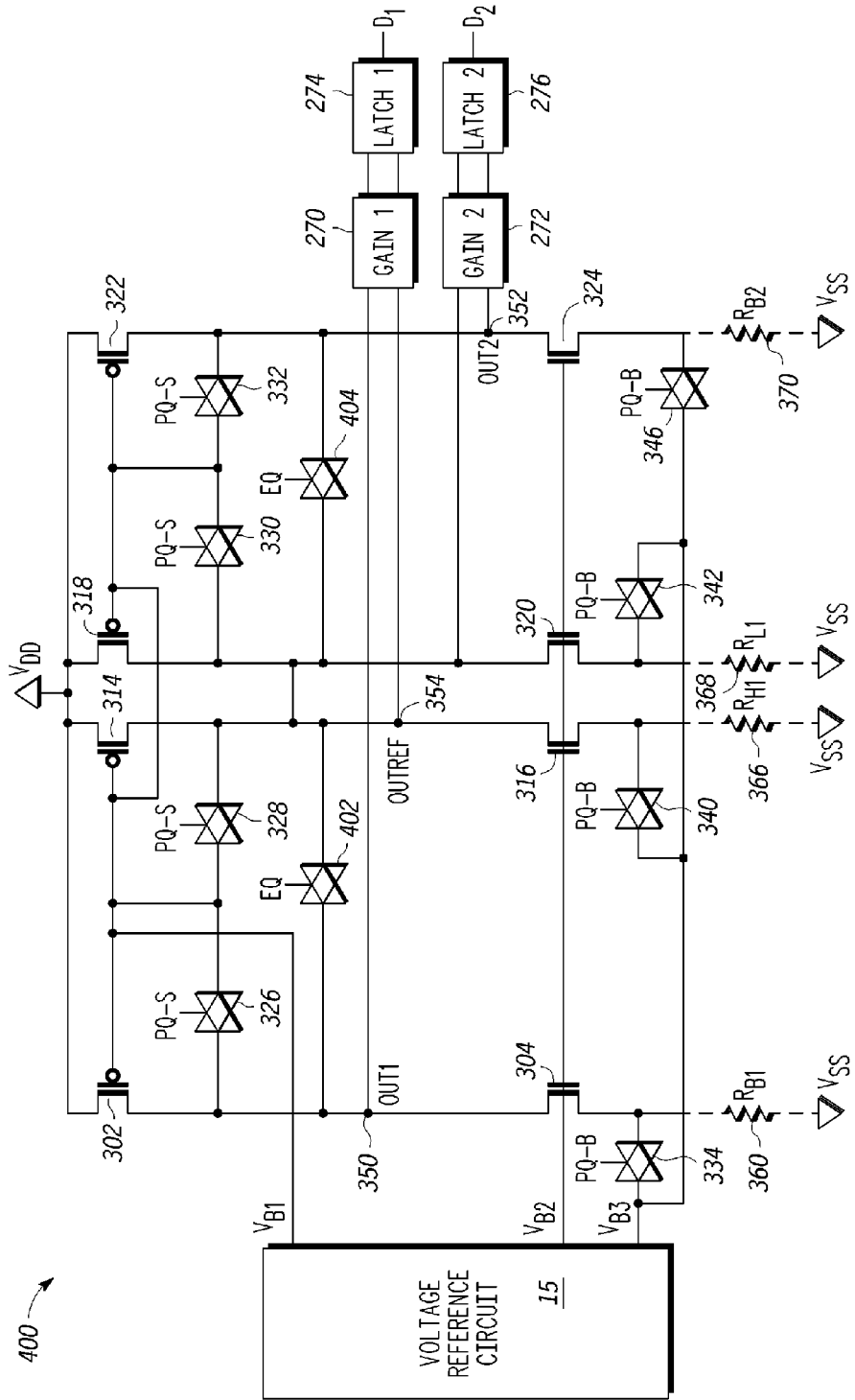
FIG. 5 is a schematic diagram of an exemplary sense amplifier with an exemplary voltage reference circuit, consistent with one embodiment of the invention.

FIG. 5 is a schematic diagram of an exemplary sense amplifier with an exemplary voltage reference circuit, consistent with one embodiment of the invention. Sense amplifier 400 may be used to sense the state of two bitcells of a memory with bitcells having at least two distinct resistance states, such as a MRAM. Voltage reference circuit 15 may generate three gate bias voltages, $V_{B1}$, $V_{B2}$, and $V_{B3}$. Sense amplifier 400 may include a p-channel transistor 302 with its source connected to a $V_{DD}$ voltage terminal. A gate of transistor 302 may be connected to bias voltage $V_{B1}$. A drain of transistor 302 may be connected to a drain of an n-channel transistor 304 at an output node 350 (producing output OUT1). A gate of transistor 304 may be connected to bias voltage $V_{B2}$. A source of transistor 304 may be coupled via one or more coupling devices (not shown), such as a column decoder to a first terminal of a first bit resistance $R_{B1}$ 360. A second terminal of first bit resistance $R_{B1}$ 360 may be coupled via one or more coupling devices (not shown) to a $V_{SS}$ terminal. Sense amplifier 400 may further include a p-channel transistor 314 with its source connected to the $V_{DD}$ voltage terminal. A drain of transistor 314 may be connected to a drain of an n-channel transistor 316 at an output node 354 (producing output OUTREF). A gate of transistor 314 may be connected to bias voltage $V_{B1}$. A switch 326, such as a transmission gate may be connected between the drain of transistor 302 and bias voltage $V_{B1}$. Switch 326 is controlled by a precharge control signal PQ-S. A switch 328, such as a transmission gate may be connected between the drain of transistor 314 and bias voltage $V_{B1}$. Switch 328 is controlled by a precharge control signal PQ-S. A gate of transistor 316 may be connected to bias voltage $V_{B2}$. A source of transistor 316 may be coupled via one or more coupling devices (not shown), such as a column decoder to a first terminal of a first high reference resistance $R_{H1}$ 366. A second terminal of first high reference resistance $R_{H1}$ 366 may be coupled via one or more coupling devices (not shown) to the $V_{SS}$ terminal. Sense amplifier 400 may further include a p-channel transistor 318 with its source connected to a $V_{DD}$ voltage terminal. A gate of transistor 318 may be connected to bias voltage $V_{B1}$. A drain of transistor 318 may be connected to a drain of an n-channel transistor 320 at node 354. A gate of transistor 320 may be connected to bias voltage $V_{B2}$. A source of transistor 320 may be coupled via one or more coupling devices (not shown), such as a column decoder to the first terminal of first low reference resistance $R_{L1}$ 368. A second terminal of first low reference resistance $R_{L1}$ 368 may be coupled via one or more coupling devices (not shown) to the $V_{SS}$ terminal. Sense amplifier 400 may further include a p-channel transistor 322 with it source connected to the $V_{DD}$ voltage terminal. A gate of transistor 322 may be connected to bias voltage $V_{B1}$. A drain of transistor 322 may be connected to a drain of an n-channel transistor 324 at node 352 (producing output OUT2). A switch 330, such as a transmission gate may be connected between the drain of transistor 318 and bias voltage $V_{B1}$. Another switch 332, such as a transmission gate may be connected between bias voltage $V_{B1}$ and the drain of transistor 322. Switches 330 and 332 are controlled by a precharge control signal PQ-S. A gate of transistor 324 may be connected to bias voltage $V_{B2}$. A source of transistor 324 may be coupled via one or more coupling devices (not shown), such as a column decoder to the first terminal of second bit resistance $R_{B2}$ 370. A second terminal of second bit resistance $R_{B2}$ 370 may be coupled via one or more coupling devices (not shown) to the $V_{SS}$ terminal.

Referring still to FIG. 5, by way of example, a switch 334 has a first terminal connected to voltage reference circuit 15 for receiving voltage $V_{B3}$ and a second terminal connected to the source of transistor 304. Another switch 340 has a first terminal connected to voltage reference circuit 15 for receiving voltage $V_{B3}$ and a second terminal connected to the source of transistor 316. Another switch 342 has a first terminal connected to voltage reference circuit 15 for receiving voltage $V_{B3}$ and a second terminal connected to the source of transistor 320. Another switch 346 has a first terminal connected to voltage reference circuit 15 for receiving voltage $V_{B3}$ and a second terminal connected to the source of transistor 324. Switches 334, 340, 342, and 346 are each controlled by a precharge control signal PQ-B. Another switch 402 may have a first terminal connected to the drain of transistor 302 and a second terminal connected to the drain of transistor 314. Another switch 404 may have a first terminal connected to the drain of transistor 322 and a second terminal connected to the drain of transistor 318. Switches 402 and 404 are each controlled by equalization signal EQ. Referring still to FIG. 5, by way of example, sense amplifier 400 may further include two gain stages and two latch stages similar to as described above with respect to FIG. 3 for sense amplifier 200.

In operation, sense amplifier 400 is used to sense a state of two memory cells, each represented by resistance $R_{B1}$ 360 and resistance $R_{B2}$ 370. Amplifier 400 is similar to amplifier 300 except bias voltage $V_{B1}$ from voltage reference circuit 15 does not act as a precharge voltage and instead generates currents through transistors 302, 314, 318, and 322 that are approximately $(I_{H2}+I_{L2})/2$. The remaining operation of sense amplifier 400 is similar to the operation of the sense amplifier 300 of FIG. 4.

Figure 6:
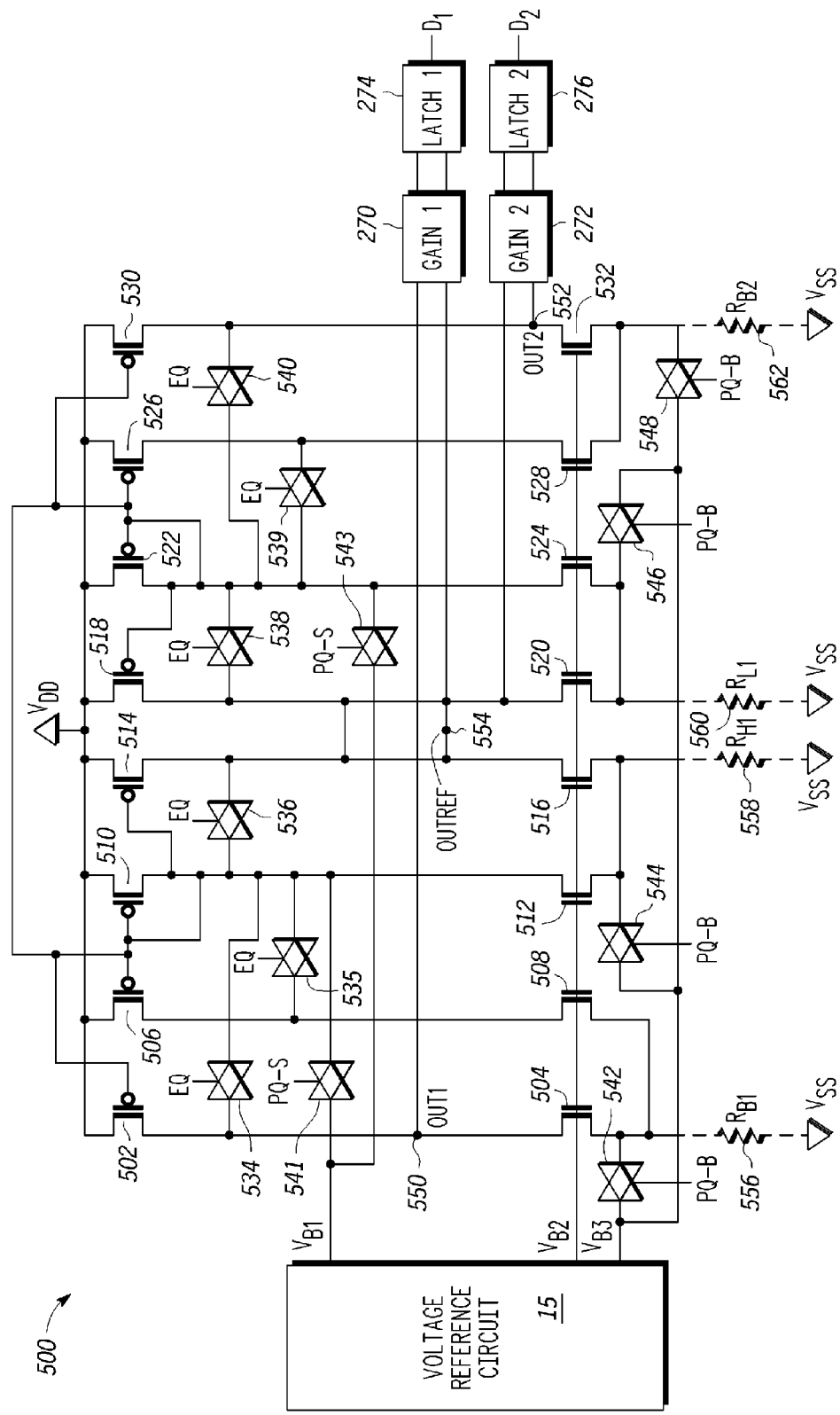
FIG. 6 is a schematic diagram of an exemplary sense amplifier with an exemplary voltage reference circuit, consistent with one embodiment of the invention.

FIG. 6 is a schematic diagram of an alternative embodiment of the exemplary sense amplifier 200 shown in FIG. 3. Like sense amplifier 200 of FIG. 3, sense amplifier 500 may be used to sense the state of two bitcells of a memory with bitcells having at least two distinct resistance states, such as a MRAM. Voltage reference circuit 15 may generate three gate bias voltages, $V_{B1}$, $V_{B2}$, and $V_{B3}$. Sense amplifier 500 may include a p-channel transistor 502 with its source connected to a $V_{DD}$ voltage terminal. A drain of transistor 502 may be connected to a drain of an n-channel transistor 504 at an output node 550 (producing output OUT1). A gate of transistor 504 may be connected to bias voltage $V_{B2}$. A source of transistor 504 may be coupled via one or more coupling devices (not shown), such as a column decoder to a first terminal of a first bit resistance $R_{B1}$ 556. A second terminal of first bit resistance $R_{B1}$ 556 may be coupled via one or more coupling devices (not shown) to a $V_{SS}$ terminal. Sense amplifier 500 may further include a p-channel transistor 506 with its source connected to a $V_{DD}$ voltage terminal. A drain of transistor 506 may be connected to a drain of an n-channel transistor 508. A gate of transistor 508 may be connected to bias voltage $V_{B2}$. A source of transistor 508 may be connected to the source of transistor 504. Sense amplifier 500 may further include a p-channel transistor 510 with its source connected to a $V_{DD}$ voltage terminal. A drain of transistor 510 may be connected to a drain of an n-channel transistor 512. A gate of transistor 510 may be connected to the drain of transistor 510, to the gate of transistor 502, and to the gate of transistor 506. A switch 534, such as a transmission gate may be connected between the drain of transistor 502 and the drain of transistor 510. Switch 534 is controlled by an equalization control signal EQ. A switch 535, such as a transmission gate, may be connected between the drain of transistor 506 and the drain of transistor 510. Switch 535 is controlled by an equalization control signal EQ. A gate of transistor 512 may be connected to bias voltage $V_{B2}$. A source of transistor 512 may be coupled via one or more coupling devices (not shown), such as a column decoder to the first terminal of a first high reference resistance $R_{H1}$ 558. A second terminal of first high reference resistance $R_{H1}$ 558 may be coupled via one or more coupling devices (not shown) to the $V_{SS}$ terminal.

Referring still to FIG. 6, sense amplifier 500 may further include a p-channel transistor 514 with it source connected to the $V_{DD}$ voltage terminal. A drain of transistor 514 may be connected to a drain of an n-channel transistor 516 at an output node 554 (producing output OUTREF). A gate of transistor 514 may be coupled to the drain of transistor 510. A switch 536, such as a transmission gate may be connected between the drain of transistor 510 and the drain of transistor 514. Switch 536 is controlled by an equalization control signal EQ. A gate of transistor 516 may be connected to bias voltage $V_{B2}$. A source of transistor 516 may be connected to the source of transistor 512. Sense amplifier 500 may further include a p-channel transistor 518 with it source connected to the $V_{DD}$ voltage terminal. A drain of transistor 518 may be connected to a drain of an n-channel transistor 520 at node 554. A gate of transistor 520 may be connected to bias voltage $V_{B2}$. A source of transistor 520 may be coupled via one or more coupling devices (not shown), such as a column decoder to the first terminal of first low reference resistance $R_{L1}$ 560. A second terminal of first low reference resistance $R_{L1}$ 560 may be coupled via one or more coupling devices (not shown) to the $V_{SS}$ terminal. Sense amplifier 500 may further include a p-channel transistor 522 with it source connected to a $V_{DD}$ voltage terminal. A gate of transistor 522 may be connected to a drain of transistor 522 and to the drain of transistor 510. The drain of transistor 522 may be connected to a drain of an n-channel transistor 524. A switch 538 such as a transmission gate may be connected between the drain of transistor 518 and the drain of transistor 522. Switch 538 is controlled by an equalization control signal EQ. A gate of transistor 524 may be connected to bias voltage $V_{B2}$. A source of transistor 524 may be connected to the source of transistor 520. Sense amplifier 500 may further include a p-channel transistor 526 with its source connected to the $V_{DD}$ voltage terminal. A drain of transistor 526 may be connected to a drain of an n-channel transistor 528. A gate of transistor 526 may be connected to the drain of transistor 522. A gate of transistor 528 may be connected to bias voltage $V_{B2}$. A source of transistor 528 may be coupled via one or more coupling devices (not shown), such as a column decoder to the first terminal of a second bit resistance $R_{B2}$ 562. A second terminal of second bit resistance $R_{B2}$ 562 may be coupled via one or more coupling devices (not shown) to the $V_{SS}$ terminal. A switch 539, such as a transmission gate, may be connected between the drain of transistor 522 and the drain of transistor 526. Switch 539 is controlled by an equalization control signal EQ. Sense amplifier 500 may further include a p-channel transistor 530 with its source connected to the $V_{DD}$ voltage terminal. A drain of transistor 530 may be connected to a drain of an n-channel transistor 532 at an output node 552 (producing output OUT2). A gate of transistor 532 may be connected to bias voltage $V_{B2}$. A source of transistor 532 may be connected to a source of transistor 532. A switch 540, such as a transmission gate may be connected between the drain of transistor 522 and the drain of transistor 530. Switch 240 is controlled by an equalization control signal EQ.

Referring still to FIG. 6, by way of example, a switch 541 has a first terminal connected to voltage reference circuit 15 for receiving voltage $V_{B1}$ and a second terminal connected to a node formed by the coupling of the drain of transistor 510 and the drain of transistor 512. Another switch 543 has a first terminal connected to voltage reference circuit 15 for receiving voltage $V_{B1}$ and a second terminal connected to a node formed by the coupling of the drain of transistor 522 and the drain of transistor 524. Switches 541 and 543 are controlled by a precharge control signal PQ-S. A switch 542 has a first terminal connected to voltage reference circuit 15 for receiving voltage $V_{B3}$ and a second terminal connected to the source of transistor 504. Another switch 544 has a first terminal connected to voltage reference circuit 15 for receiving voltage $V_{B3}$ and a second terminal connected to the source of transistor 512. Another switch 546 has a first terminal connected to voltage reference circuit 15 for receiving voltage $V_{B3}$ and a second terminal connected to the source of transistor 524. Another switch 548 has a first terminal connected to voltage reference circuit 15 for receiving voltage $V_{B3}$ and a second terminal connected to the source of transistor 532. Switches 542, 544, 546, and 548 are controlled by a precharge control signal PQ-B.

With continued reference to FIG. 6, transistor 502 may be stronger than transistor 506. By way of example, transistor 502 and transistor 506 may have a gain ratio, such that transistor 502 provides more gain than transistor 506. This could be accomplished by having appropriately sized transistors or by providing multiple transistors as part of the stronger leg. Transistors 504 and 508, transistors 514 and 510, transistors 516 and 512, transistors 518 and 522, transistors 520 and 524, transistors 526 and 530, and transistors 528 and 532 may similarly have a gain ratio, which is similar to the gain ratio of transistors 502 and 506.

Referring still to FIG. 6, by way of example, sense amplifier 500 may further include a gain stage GAIN 1 270 for receiving voltage OUT1 from node 550 and voltage OUTREF from node 554. The output of gain stage GAIN 1 270 may be coupled to a latch stage LATCH 1 274 for storing a first bit $D_1$. Sense amplifier 500 may further include a gain stage GAIN 2 272 for receiving voltage OUT2 from node 552 and voltage OUTREF from node 554. The output of gain stage GAIN 2 272 may be coupled to a latch stage LATCH 2 276 for storing a second bit $D_2$.

In operation, sense amplifier 500 is used to sense a state of two memory cells, each represented by resistance $R_{B1}$ 556 and resistance $R_{B2}$ 562. If current flowing through $R_{H1}$ is labeled as $I_{H1}$ and current flowing through $R_{L1}$ is labeled $I_{L1}$, then the current flowing through each of transistors 512 and 516 would be $I_{H1}/2$ and the current flowing through each of transistors 520 and 524 would be $I_{L1}/2$. Because transistors 510 and 522 have gates and drains tied together and they supply current to transistors 512 and 524, then each of transistors 510 and 522 supply $(I_{H1}+I_{L1})/4$. Furthermore, since transistors 502, 506, 514, 518, 526, and 530 mirror the current flowing through 510 and 522, they each carry $(I_{H1}+I_{L1})/4$. Since the currents through each of transistors 514 and 518 are substantially $(I_{H1}+I_{L1})/4$ and the sum of the currents through transistors 516 and 520 would be $I_{H1}/2+I_{L1}/2$, the current into node 554 would be approximately zero. The voltage at node 554 labeled as OUTREF would act as a reference voltage for the gain stages GAIN 1 and GAIN 2. The voltage at node 550 (labeled as OUT1) will represent the difference between current flowing through transistor 502 and transistor 504. Similarly, the voltage at node 552 (labeled as OUT2) will represent the difference between current flowing through transistor 530 and transistor 532. If the current in $R_{B1}$ is labeled as $I_{B1}$, then the current in each of transistor 504 and 508 would be $I_{B1}/2$, since their gates and sources are tied together. If resistance $R_{B1}$ is in a low-resistance state (substantially equal to resistance $R_{L1}$), then the current flowing through transistor 504 would be higher than $(I_{H1}+I_{L1})/4$. On the other hand, if resistance $R_{B1}$ is in a high-resistance state (substantially equal to resistance $R_{L1}$), then the current flowing through transistor 504 would be lower than $(I_{H1}+I_{L1})/4$. If the current in $R_{B2}$ is labeled as $I_{B2}$, then the current in each of transistor 528 and 532 would be $IB_2/2$, since their gates and sources are tied together. If resistance $R_{B2}$ is in a low-resistance state (substantially equal to resistance $R_{L1}$), then the current flowing through transistor 532 would be higher than $(I_{H1}+I_{L1})/4$. On the other hand, if resistance $R_{B2}$ is in a high-resistance state (substantially equal to resistance $R_{H1}$), then the current flowing through transistor 532 would be lower than $(I_{H1}+I_{L1})/4$. Note that the capacitance at each of node 550 and 552 would be half that of the capacitance at node 554. Thus, each input at each gain stage sees approximately the same capacitance. By way of example, the outputs generated by sense amplifier 500 may then be processed by gain stages GAIN 1 270, GAIN 2 272, LATCH 1 274, and LATCH 2 276, similar to as described above with respect to FIG. 3.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory circuit, comprising:
    a reference voltage circuit comprising:
        a first transistor having a first current electrode coupled to a first power supply terminal, a control electrode for receiving a first bias voltage, and a second current electrode, wherein the first transistor is of a first conductivity type;
        a second transistor having a first current electrode coupled to the second current electrode of the first transistor, a control electrode for receiving a second bias voltage, and a second current electrode, wherein the second transistor is of a second conductivity type;
        a third transistor having a first current electrode coupled to the second current electrode of the first transistor, a control electrode for receiving the second bias voltage, and a second current electrode, wherein the third transistor is of the second conductivity type;
        a first reference memory cell having a first terminal coupled to the second current electrode of the second transistor and second terminal coupled to a second power supply terminal, wherein the first reference memory cell is programmed to a first logic state; and
        a second reference memory cell having a first terminal coupled to the second current electrode of the third transistor and second terminal coupled to the second power supply terminal, wherein the second reference memory cell is programmed to a second logic state;
    a fourth transistor having a first current electrode coupled to the first power supply terminal, a control electrode for receiving the first bias voltage, and a second current electrode, wherein the fourth transistor is of the first conductivity type;
    a fifth transistor having a first current electrode coupled to the second current electrode of the fourth transistor, a control electrode for receiving the second bias voltage, and a second current electrode, wherein the fifth transistor is of the second conductivity type;
    a first memory cell having a first terminal coupled to the second current electrode of the fifth transistor and a second terminal coupled to the second power supply terminal;
    a sixth transistor having a first current electrode coupled to the first power supply terminal, a control electrode for receiving the first bias voltage, and a second current electrode, wherein the sixth transistor is of the first conductivity type;
    a seventh transistor having a first current electrode coupled to the second current electrode of the sixth transistor, a control electrode for receiving the second bias voltage, and a second current electrode, wherein the seventh transistor is of the second conductivity type;
    a second memory cell having a first terminal coupled to the second current electrode of the seventh transistor and a second terminal coupled to the second power supply terminal;
    a first comparator having a first input coupled to the second current electrode of the first transistor, a second input coupled to the second current electrode of the fourth transistor, and an output corresponding to a signal representative of a logic state of the first memory cell; and
    a second comparator having a first input coupled to the second current electrode of the first transistor, a second input coupled to the second current electrode of the sixth transistor, and an output corresponding to a signal representative of a logic state of the second memory cell.

2. The memory circuit of claim 1, wherein the first conductivity type is P channel and the second conductivity type is N channel.

3. The memory circuit of claim 1, further comprising equalization means for equalizing the second current electrodes of the first, fourth, and sixth transistors in response to an equalization signal.

4. The memory circuit of claim 1, wherein the first transistor has a gain twice that of the fourth transistor.

5. The memory circuit of claim 1, further comprising an eighth transistor having a first current electrode coupled to the first power supply terminal, a control electrode for receiving the first bias voltage, and a second current electrode coupled to the second current electrode of the first transistor, wherein the eighth transistor is of the first conductivity type.

6. The memory circuit of claim 1, further comprising:
a first precharge means for precharging the second current electrodes of the first, fourth, and sixth transistors to the first bias voltage in response to a precharge signal;
a second precharge means for precharging the second current electrodes of the second, third, fifth, and seventh transistors to a third bias voltage.

7. The memory of claim 1, further comprising a bias circuit for providing the first bias voltage, the bias circuit comprising:
an eighth transistor having a first current electrode coupled to the first power supply terminal and a control electrode and a second current electrode coupled to each other, wherein the eighth transistor is of the first conductivity type and wherein the first bias voltage is provided by the second current electrode of the eighth transistor;
a ninth transistor a having a first current electrode coupled to the second current electrode of the eighth transistor, a control electrode for receiving the second bias voltage, and a second current electrode, wherein the ninth transistor is of the second conductivity type;
a tenth transistor a having a first current electrode coupled to the second current electrode of the eighth transistor, a control electrode for receiving the second bias voltage, and a second current electrode, wherein the tenth transistor is of the second conductivity type;
a third reference memory cell having a first terminal coupled to the second current electrode of the ninth transistor and second terminal coupled to a second power supply terminal, wherein the third reference memory cell is programmed to the first logic state; and
a fourth reference memory cell having a first terminal coupled to the second current electrode of the tenth transistor and second terminal coupled to the second power supply terminal, wherein the fourth reference memory cell is programmed to the second logic state.

8. The memory circuit of claim 7, wherein the eighth transistor has a gain twice that of the fourth transistor.

9. The memory circuit of claim 7, further comprising an eleventh transistor having a first current electrode coupled to the first power supply terminal and a control electrode and a second current electrode coupled to each other and to the second current electrode of the eighth transistor, wherein the eleventh transistor is of the first conductivity type.

10. The memory circuit of claim 7, further comprising equalization means for equalizing the second current electrodes of the first transistor, the fourth transistor, the sixth transistor, and the eighth transistor in response to an equalization signal.

11. A memory circuit, comprising,
a reference circuit comprising:
a first transistor having a first current electrode coupled to a first power supply terminal and a control electrode and a second current electrode coupled together, wherein the first transistor is of a first conductivity type;
a second transistor having a first current electrode coupled to a first power supply terminal, a control electrode coupled to the control electrode of the first transistor, and a second current electrode, wherein the second transistor is of the first conductivity type;
a third transistor having a first current electrode coupled to the second current electrode of the first transistor, a control electrode for receiving a first bias voltage, and a second current electrode, wherein the third transistor is of a second conductivity type;
a fourth transistor having a first current electrode coupled to the second current electrode of the second transistor, a control electrode for receiving the first bias voltage, and a second current electrode coupled to the second current electrode of the third transistor, wherein the fourth transistor is of the second conductivity type;
a first reference memory cell having a first terminal coupled to the second current electrode of the third transistor and second terminal coupled to a second power supply terminal, wherein the first reference memory cell is programmed to a first logic state; and
a second reference memory cell having a first terminal coupled to the second current electrode of the third transistor and second terminal coupled to the second power supply terminal, wherein the second reference memory cell is programmed to a second logic state;
a fifth transistor having a first current electrode coupled to the first power supply terminal, a control electrode coupled to the control electrode of the first transistor, and a second current electrode, wherein the fifth transistor is of the first conductivity type;
a sixth transistor having a first current electrode coupled to the second current electrode of the fifth transistor, a control electrode for receiving the first bias voltage, and a second current electrode, wherein the sixth transistor is of the second conductivity type;
a first memory cell having a first terminal coupled to the second current electrode of the sixth transistor and a second terminal coupled to the second power supply terminal;
a seventh transistor having a first current electrode coupled to the first power supply terminal, a control electrode coupled to the control electrode of the first transistor, and a second current electrode, wherein the seventh transistor is of the first conductivity type;
an eighth transistor having a first current electrode coupled to the second current electrode of the seventh transistor, a control electrode for receiving the first bias voltage, and a second current electrode, wherein the eighth transistor is of the second conductivity type;
a second memory cell having a first terminal coupled to the second current electrode of the eighth transistor and a second terminal coupled to the second power supply terminal;
a first comparator having a first input coupled to the second current electrode of the second transistor, a second input coupled to the second current electrode of the fifth transistor, and an output for providing a signal representative of a logic state of the first memory cell; and a second comparator having a first input coupled to the second current electrode of the second transistor, a second input coupled to the second current electrode of the seventh transistor, and an output for providing a signal representative of the logic state of the second memory cell.

12. The memory circuit of claim 11 wherein the first comparator comprises:
a first input stage having an input as the first input of the first comparator coupled to the second current electrode of the second transistor and an output;
a second input stage having an input as the second input of the first comparator coupled to the second current electrode of the fifth transistor and an output; and
a latch having a first input coupled to the output of the first input stage, a second input coupled to the output of the second input stage, and an output as the output of the first comparator.

13. The memory circuit of claim 12, wherein the first comparator further comprises a dummy load having an input coupled to the second current electrode of the fifth transistor, wherein the second input stage has a capacitance matching the first input stage and the dummy load has a capacitance matching the first input stage.

14. The circuit of claim 13, wherein:
the first input stage comprises:
a ninth transistor having a first current electrode coupled to the first power supply terminal, a control electrode as the input of the first input stage, and a second current electrode, wherein the ninth transistor is of the first conductivity type; and
a tenth transistor having a first current electrode coupled to the second current electrode of the ninth transistor, a control electrode for receiving a second bias voltage, and a second current electrode coupled to the second power supply terminal, wherein the tenth transistor is of the second conductivity type and the first current electrode of the tenth transistor and the second current electrode of the ninth transistor provide the output of the first input stage; and
the second input stage comprises:
an eleventh transistor having a first current electrode coupled to the first power supply terminal, a control electrode as the input of the second input stage, and a second current electrode, wherein the eleventh transistor is of the first conductivity type; and
a twelfth transistor having a first current electrode coupled to the second current electrode of the eleventh transistor, a control electrode for receiving a second bias voltage, and a second current electrode coupled to the second power supply terminal, wherein the twelfth transistor is of the second conductivity type and the first current electrode of the twelfth transistor and the second current electrode of the eleventh transistor provide the output of the second input stage; and
the dummy load comprises:
a thirteenth transistor having a first current electrode coupled to the first power supply terminal, a control electrode coupled to the control electrode of the eleventh transistor, and a second current electrode, wherein the thirteenth transistor is of the first conductivity type; and a fourteenth transistor having a first current electrode coupled to the second current electrode of the thirteenth transistor, a control electrode for receiving the second bias voltage, and a second current electrode coupled to the second power supply terminal, wherein the fourteenth transistor is of the second conductivity type.

15. The memory circuit of claim 11 further comprising equalization means for equalizing the second current electrodes of the first, second, fifth, and seventh transistors in response to an equalization signal.

16. The memory circuit of claim 11, further comprising:
a first precharge means for precharging the second current electrodes of the first, second, fifth, and seventh transistors to a second bias voltage in response to a first precharge signal;
a second precharge means for precharging the second current electrodes of the third, fourth, sixth, and eighth transistors to a third bias voltage in response to a second precharge signal.

17. A memory circuit, comprising:
a reference circuit comprising:
a first transistor having a first current electrode coupled to a first power supply terminal and a control electrode and a second current electrode coupled together, wherein the first transistor is of a first conductivity type;
a second transistor having a first current electrode coupled to a first power supply terminal, a control electrode coupled to the control electrode of the first transistor, and a second current electrode, wherein the second transistor is of the first conductivity type;
a third transistor having a first current electrode coupled to the second current electrode of the first transistor, a control electrode for receiving a first bias voltage, and a second current electrode, wherein the third transistor is of a second conductivity type;
a fourth transistor having a first current electrode coupled to the second current electrode of the second transistor, a control electrode for receiving the first bias voltage, and a second current electrode coupled to the second current electrode of the third transistor, wherein the fourth transistor is of the second conductivity type;
a first reference memory cell having a first terminal coupled to the second current electrode of the third transistor and second terminal coupled to a second power supply terminal, wherein the first reference memory cell is programmed to a first logic state;
a fifth transistor having a first current electrode coupled to the first power supply terminal and a control electrode and a second current electrode coupled together and coupled to the second current electrode of the first transistor, wherein the fifth transistor is of the first conductivity type;
a sixth transistor having a first current electrode coupled to a first power supply terminal, a control electrode coupled to the control electrode of the fifth transistor, and a second current electrode, wherein the sixth transistor is of the first conductivity type;
a seventh transistor having a first current electrode coupled to the second current electrode of the fifth transistor, a control electrode for receiving the first bias voltage, and a second current electrode, wherein the seventh transistor is of the second conductivity type;

an eighth transistor having a first current electrode coupled to the second current electrode of the sixth transistor, a control electrode for receiving the first bias voltage, and a second current electrode coupled to the second current electrode of the seventh transistor, wherein the eighth transistor is of the second conductivity type;

a second reference memory cell having a first terminal coupled to the second current electrode of the seventh transistor and second terminal coupled to the second power supply terminal, wherein the second reference memory cell is programmed to a second logic state;

a ninth transistor having a first current electrode coupled to the first power supply terminal, a control electrode coupled to the control electrode of the first transistor, and a second current electrode, wherein the ninth transistor is of the first conductivity type;

a tenth transistor having a first current electrode coupled to the second current electrode of the ninth transistor, a control electrode for receiving the first bias voltage, and a second current electrode, wherein the tenth transistor is of the second conductivity type;

an eleventh transistor having a first current electrode coupled to the first power supply terminal, a control electrode coupled to the control electrode of the first transistor, and a second current electrode, wherein the eleventh transistor is of the first conductivity type;

a twelfth transistor having a first current electrode coupled to the second current electrode of the eleventh transistor, a control electrode for receiving the first bias voltage, and a second current electrode coupled to the second current electrode of the tenth transistor, wherein the twelfth transistor is of the second conductivity type;

a first memory cell having a first terminal coupled to the second current electrode of the tenth transistor and a second terminal coupled to the second power supply terminal;

a thirteenth transistor having a first current electrode coupled to the first power supply terminal, a control electrode coupled to the control electrode of the fifth transistor, and a second current electrode, wherein the thirteenth transistor is of the first conductivity type;

a fourteenth transistor having a first current electrode coupled to the second current electrode of the thirteenth transistor, a control electrode for receiving the first bias voltage, and a second current electrode, wherein the fourteenth transistor is of the second conductivity type;

a fifteenth transistor having a first current electrode coupled to the first power supply terminal, a control electrode coupled to the control electrode of the fifth transistor, and a second current electrode, wherein the fifteenth transistor is of the first conductivity type;

a sixteenth transistor having a first current electrode coupled to the second current electrode of the fifteenth transistor, a control electrode for receiving the first bias voltage, and a second current electrode coupled to the second current electrode of the fourteenth transistor, wherein the sixteenth transistor is of the second conductivity type;

a second memory cell having a first terminal coupled to the second current electrode of the fourteenth transistor and a second terminal coupled to the second power supply terminal;

a first comparator having a first input coupled to the second current electrode of the second transistor, a second input coupled to the second current electrode of the eleventh transistor, and an output for providing a signal representative of a logic state of the first memory cell; and a second comparator having a first input coupled to the second current electrode of the sixth transistor, a second input coupled to the second current electrode of the fifteenth transistor, and an output for providing a signal representative of the logic state of the second memory cell.

18. The memory circuit of claim 17, wherein the second transistor and the first transistor have a first gain ratio, the sixth transistor and the fifth transistor have a second gain ratio, the eleventh transistor and the ninth transistor have a third gain ratio, the fifteenth transistor and the thirteenth transistor have a fourth gain ratio, the fourth transistor and the third transistor have a fifth gain ratio, the eighth transistor and the seventh transistor have a sixth gain ratio, the twelfth transistor and the tenth transistor have a seventh gain ratio, and the sixteenth transistor and the fourteenth transistor have an eighth gain ratio, such that the second, third, fourth, fifth, sixth, seventh, and eighth gain ratios are substantially the same as the first gain ratio.

19. The memory circuit of claim 17, further comprising equalization means for equalizing the second current electrodes of the first, second, sixth, ninth, eleventh, thirteenth, and fifteenth transistors in response to an equalization signal.

20. The memory circuit of claim 18, further comprising:

a first precharge means for precharging the second current electrodes of the first, second, sixth, ninth, eleventh, thirteenth, and fifteenth transistors to a second bias voltage in response to a first precharge signal; and a second precharge means for precharging the second current electrodes of the third, seventh, tenth, and fourteenth transistors to a third bias voltage in response to a second precharge signal.

* * * * *